United States Patent
Ten Kate et al.

(10) Patent No.: US 8,279,396 B2
(45) Date of Patent: Oct. 2, 2012

(54) LITHOGRAPHIC APPARATUS AND DEVICE MANUFACTURING METHOD

(75) Inventors: Nicolaas Ten Kate, Almkerk (NL); Willem Jurrianus Venema, Eindhoven (NL); Ronald Van Der Ham, Maarheeze (NL)

(73) Assignee: ASML Netherlands B.V., Veldhoven (NL)

( * ) Notice: Subject to any disclaimer, the term of this patent is extended or adjusted under 35 U.S.C. 154(b) by 735 days.

(21) Appl. No.: 12/292,964

(22) Filed: Dec. 1, 2008

(65) Prior Publication Data

US 2009/0168032 A1 Jul. 2, 2009
US 2010/0231875 A2 Sep. 16, 2010

Related U.S. Application Data

(60) Provisional application No. 60/996,736, filed on Dec. 3, 2007, provisional application No. 61/006,023, filed on Dec. 14, 2007.

(51) Int. Cl.
G03B 27/52 (2006.01)
G03B 27/32 (2006.01)

(52) U.S. Cl. ............................................ 355/30; 355/77
(58) Field of Classification Search ................. 355/30, 355/53, 72, 73
See application file for complete search history.

(56) References Cited

U.S. PATENT DOCUMENTS

| 4,509,852 | A | 4/1985 | Tabarelli et al. |
| 6,989,234 | B2 * | 1/2006 | Kolar et al. ........................ 435/6 |
| 7,050,146 | B2 * | 5/2006 | Duineveld et al. ............. 355/30 |
| 7,839,483 | B2 | 11/2010 | Leenders et al. |
| 2003/0227100 | A1 * | 12/2003 | Chandross et al. .......... 264/1.36 |
| 2004/0136494 | A1 | 7/2004 | Lof et al. |
| 2004/0160582 | A1 | 8/2004 | Lof et al. |
| 2004/0207824 | A1 | 10/2004 | Lof et al. |
| 2004/0211659 | A1 * | 10/2004 | Velev ........................... 204/164 |
| 2006/0139594 | A1 | 6/2006 | Hara et al. |
| 2007/0085034 | A1 * | 4/2007 | Chang et al. ............... 250/492.2 |
| 2007/0146666 | A1 * | 6/2007 | Antonius Leenders et al. ........................... 355/53 |

FOREIGN PATENT DOCUMENTS

| EP | 1 420 300 A2 | 5/2004 |
| EP | 1628163 A2 | 2/2006 |
| JP | 2006-346583 | 12/2006 |
| JP | 2007-194613 | 8/2007 |
| WO | WO 99/49504 A1 | 9/1999 |
| WO | 2005/022616 | 3/2005 |

OTHER PUBLICATIONS

Japanese Office Action dated May 31, 2011 in corresponding Japanese Patent Application No. 2008-307832.

* cited by examiner

*Primary Examiner* — Toan Ton
*Assistant Examiner* — Michelle Iacoletti
(74) *Attorney, Agent, or Firm* — Pillsbury Winthrop Shaw Pittman LLP

(57) ABSTRACT

An immersion lithographic apparatus is provided with an electrode set to remove unwanted droplets of an immersion fluid from a particular surface. Unwanted droplets of immersion fluid may form on any number of different surfaces of the immersion apparatus, such as on a liquid barrier member. If allowed to evaporate and/or dry, these droplets may cause a problem such as uncontrolled heat loading of the apparatus and/or staining of the surface. An electrode set is provided on a surface where the droplets are likely to be formed. A controlled voltage is applied to the electrodes within the electrode set in order to electrostatically remove the droplets from the surface.

35 Claims, 6 Drawing Sheets

LITHOGRAPHIC APPARATUS AND DEVICE MANUFACTURING METHOD

This application claims priority and benefit under 35 U.S.C. §119(e) to U.S. Provisional Patent Application Ser. No. 60/996,736, entitled "Lithographic Apparatus and Device Manufacturing Method", filed on Dec. 3, 2007, and to U.S. Provisional Patent Application Ser. No. 61/006,023, entitled "Lithographic Apparatus and Device Manufacturing Method", filed on Dec. 14, 2007. The contents of those applications are incorporated herein in their entirety by reference.

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The liquid may be distilled water, although other liquids can be used. An embodiment of the present invention will be described with reference to liquid. However, other fluids may be suitable, particularly a wetting fluid, an incompressible fluid and/or a fluid with higher refractive index than air, desirably a higher refractive index than water. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including liquid such as water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable are a hydrocarbon, a fluorohydrocarbon, or an aqueous solution. These are also included in an embodiment of the present invention.

However, submersing the substrate or substrate and substrate table in a bath of liquid (see, for example, U.S. Pat. No. 4,509,852, hereby incorporated in its entirety by reference) means that there is a large body of liquid that must be accelerated during a scanning exposure. This requires additional or more powerful motors and turbulence in the liquid may lead to undesirable and unpredictable effects.

One of the solutions proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent application publication no. WO 99/49504, hereby incorporated in its entirety by reference. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

An immersion lithography solution with a localized liquid supply system is shown in FIG. 4. Liquid is supplied by two groove inlets IN on either side of the projection system PL and is removed by a plurality of discrete outlets OUT arranged radially outwardly of the inlets IN. The inlets IN and outlets OUT can be arranged in a plate with a hole in its center and through which the projection is project. Liquid is supplied by one groove inlet IN on one side of the projection system PS and removed by a plurality of discrete outlets OUT on the other side of the projection system PL. This causes a flow of a thin film of liquid between the projection system PS and the substrate W. The choice of which combination of inlet IN and outlets OUT to use can depend on the direction of movement of the substrate W (the other combination of inlet IN and outlets OUT being inactive).

In European Patent Application Publication No. 1420300 and United States Patent Application Publication No. 2004-0136494, each of which is hereby incorporated in its entirety by reference, the idea of a twin or dual stage immersion lithography apparatus is disclosed. Such an apparatus is provided with two tables for supporting the substrate. Leveling measurements are carried out with a table at a first position, without immersion liquid. Exposure is carried out with a table at a second position, where immersion liquid is present. Alternatively, the apparatus may have only one table movable between exposure and measurement positions.

In an immersion lithographic apparatus, droplets of immersion liquid may be unintentionally transferred to, or left behind on, a surface or part of a surface where no immersion liquid is intended to be situated at a particular time. This may cause a problem which may result in a defective substrate being produced.

SUMMARY

It is desirable, for example, to remove unwanted droplets of immersion liquid from a surface of an immersion lithographic apparatus.

According to an aspect of the present invention, there is provided an immersion lithographic apparatus comprising:

a surface from at least a portion of which a fluid droplet is to be removed; and an active droplet removal system formed on or in the surface, wherein the portion of the surface is sufficiently removed from adjacent portions of the apparatus for there to be insufficient net capillary force acting on a fluid droplet on the portion of the surface to cause the fluid droplet to move by capillary action, and the active droplet removal system is arranged to manipulate the fluid droplet on the portion of the surface without the assistance of capillary action.

According to an aspect of the present invention, there is provided an immersion lithographic apparatus comprising:

a surface from at least a portion of which a fluid droplet is to be removed; and an active droplet removal system formed on or in the surface and for manipulating a fluid droplet around the surface, wherein the active droplet removal system is arranged to manipulate a fluid droplet that is in contact with no surfaces other than the surface comprising the portion from which it is to be removed.

According to an aspect of the present invention, there is provided an immersion lithographic apparatus comprising:

a surface from at least a portion of which a fluid droplet is to be removed; and an active droplet removal system formed on or in the surface and for manipulating a fluid droplet around the surface, wherein the portion of the surface is sufficiently removed from all other surfaces that surface tension of the fluid is not sufficient for fluid to bridge a gap between the portion of the surface and any other surface, and the active droplet removal system is arranged to manipulate a fluid droplet on the portion of the surface.

According to an aspect of the present invention, there is provided an immersion lithographic apparatus comprising:

a surface from at least a portion of which a fluid droplet is to be removed; and an active droplet removal system formed on or in the surface and for manipulating a fluid droplet around the surface, wherein the active droplet removal system is arranged to manipulate a fluid droplet on the portion of the surface, and the center of curvature of the portion of the surface is on the opposite side of the surface to the side on which the fluid droplet is to be manipulated.

According to an aspect of the present invention, there is provided a device manufacturing method comprising:

projecting a projection beam of radiation onto a substrate using a projection system;

supplying immersion fluid, using an immersion system, to a space between the projection system and the substrate; and removing, without the assistance of capillary action, an unwanted droplet of the immersion fluid on which insufficient net capillary force to cause the droplet to move by capillary action is acting from a portion of a surface of the projection system or the immersion system by applying a controlled voltage to electrodes provided in or on the surface.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
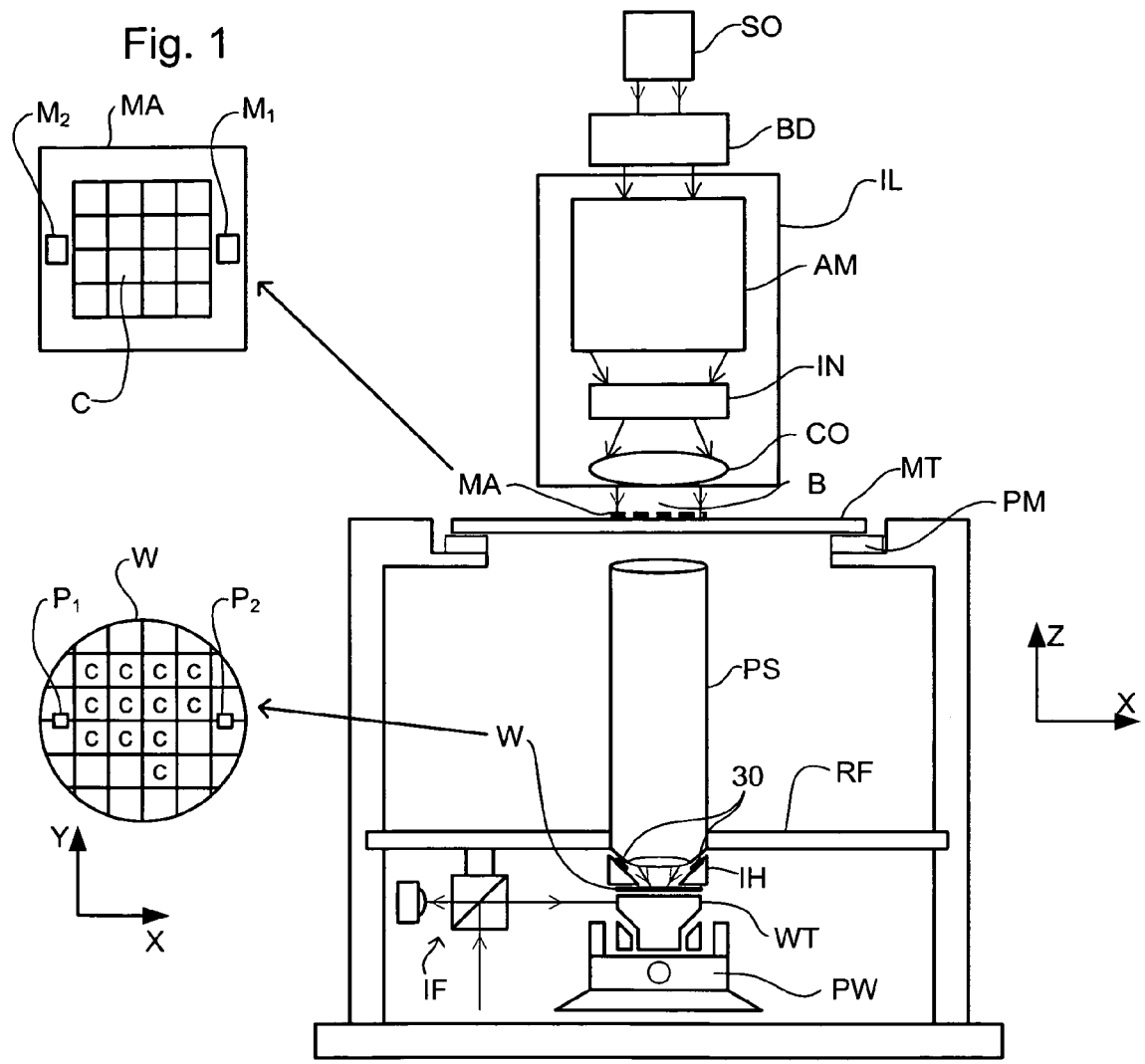
FIG. 1 depicts a lithographic apparatus according to an embodiment of the invention.
Figure 2:
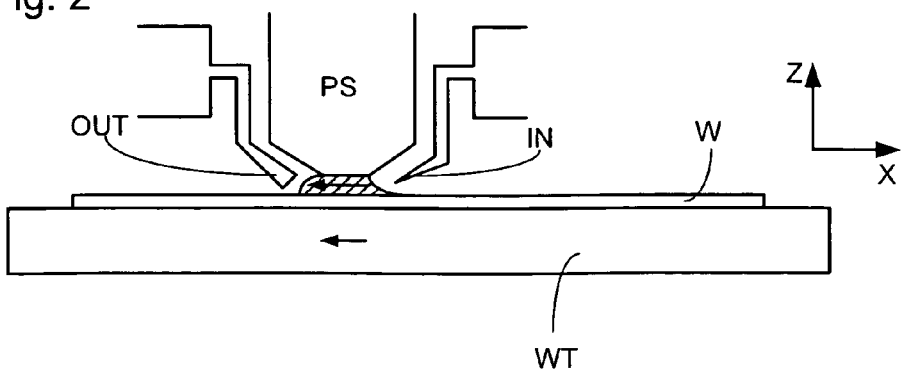
FIGS. 2 and 3 depict a liquid supply system for use in a lithographic projection apparatus.
Figure 3:
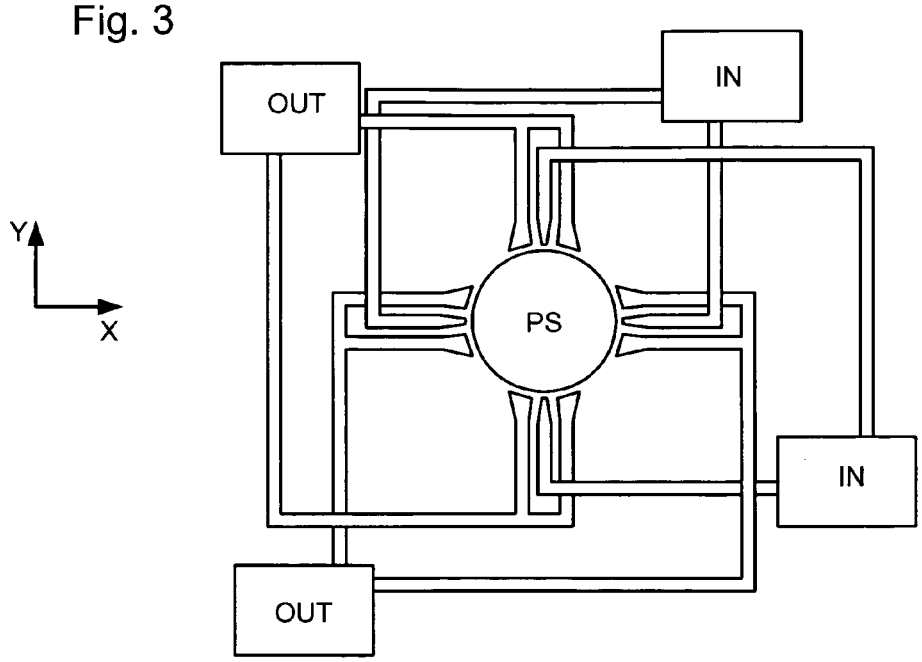
Figure 4:
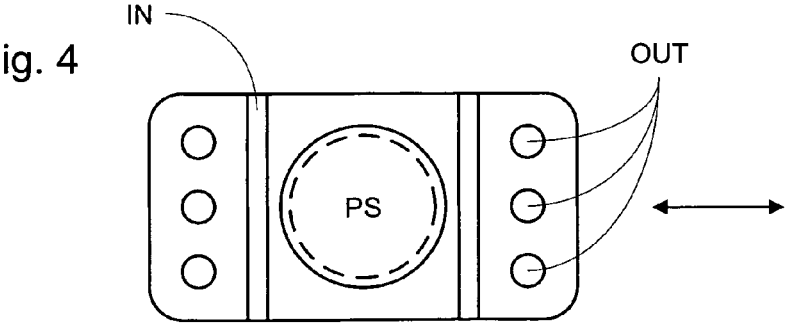
FIG. 4 depicts a further liquid supply system for use in a lithographic projection apparatus.
Figure 4:
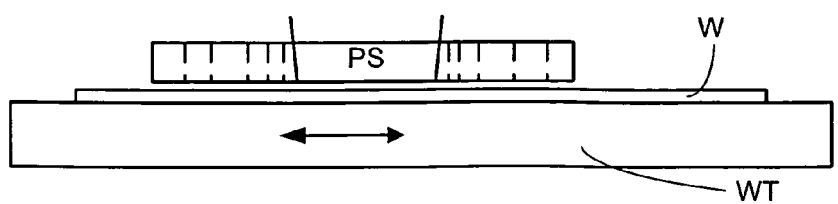

FIG. 1 schematically depicts a lithographic apparatus according to one embodiment of the invention. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

In an immersion lithographic apparatus, droplets of immersion liquid may be unintentionally transferred to, or left behind on, a surface or part of a surface where no immersion liquid is intended to be situated at a particular time. This may cause a problem which may result in a defective substrate being produced.

A problem may be that the presence of unwanted immersion liquid droplets may cause a defect itself. For example, if unwanted droplets are formed or left behind on a lens or sensor element, then this may alter the optical properties of that element and lead to inaccuracy in, for example, measurement and/or focusing.

Further, if the unwanted immersion liquid droplets are left on the surface, then they may evaporate. In turn, this evaporation may cause a thermal load to be applied to the element of the lithographic apparatus comprising the surface on which the unwanted droplets are situated. This thermal loading may result in further inaccuracy, for example by changing an optical property of the element and/or physically deforming the element in an uncontrolled manner.

A further problem caused by allowing the unwanted droplets to remain on the surface and evaporate is that contaminants may build-up on the surface once the liquid has evaporated. The contaminants may be a result of impurities that have built up in the immersion liquid or of additives in the immersion liquid.

A possible technique for removing the unwanted immersion liquid droplets is to passively remove them from the surface on which they are situated. This can be achieved by applying a liquid-phobic coating to that surface. Alternatively, it can be achieved by using a combination of liquid-phobic and liquid-philic coatings. However these techniques for passively removing the unwanted droplets may remove the droplets relatively slowly. Thus, one or more of the problems associated with their presence outlined above may occur.

A quicker way of removing the unwanted immersion liquid droplets is to use a gas stream to blow them away from the surface. However, using such a gas stream may result in partial evaporation of the droplets, which in turn may result in one or more of the associated problems discussed herein such as, for example, thermal loading and/or build up of impurities.

It is desirable to remove unwanted droplets of immersion liquid from a surface of an immersion lithographic apparatus, desirably its immersion system, quickly and without incurring significant evaporation of the immersion liquid droplets. As used herein, the "immersion system" can comprise at least a liquid handling system, the substrate table WT and a final element of the projection system PS. Although an embodiment of the invention is discussed below with reference to liquid, the same principles can be used for another fluid. For example, it will be understood that an embodiment of the present invention is applicable to at least fluid droplets, liquid droplets, fluid droplets with solid particles suspended therein, and liquid droplets with solid particles suspended therein.

The term droplet can be taken to mean, for example, a discrete droplet that does not form part of a body of liquid larger than itself. Furthermore, a droplet could not be connected, via liquid, to another body of liquid. It will also be understood that references in this application to control or removal of a plurality of droplets apply equally to the control or removal of a single droplet and vice versa.

It will also be understood that an embodiment of the invention may be applied to any component in a lithographic apparatus. In particular, it may be applied to any component in an immersion lithographic apparatus including the immersion system. An embodiment of the invention is most likely to be applied to a surface susceptible of having unwanted immersion liquid droplets formed thereon. This may include, for example, a surface of and/or around: the final element of the projection system PS; the substrate W; the substrate table WT; a liquid handling system, such as a barrier member 120 of a liquid handling system; and/or an immersion system, namely a system for providing, confining or controlling immersion liquid in an immersion lithography apparatus.

An embodiment of the invention is particularly applicable to any form of immersion lithography apparatus which may comprise an immersion system having a localized liquid supply system (i.e. "local area") or having an unconfined liquid supply system such as a "bath", and "all-wet" arrangement. In a "bath" arrangement, the substrate is fully immersed (i.e. submerged) in a bath of the immersion liquid. In an "all-wet" arrangement, the major surface of the substrate facing the projection system is fully covered with immersion liquid. The immersion liquid may cover the substrate in a film, which is desirably thin. The immersion liquid may be supplied so that it is free to flow over the substrate and maybe over the substrate table surrounding the major surface of the substrate. Embodiments discussed below relate to "local area" and "all-wet" immersion lithography apparatus, but embodiments could also relate to any other type of lithography apparatus.

Figure 5:
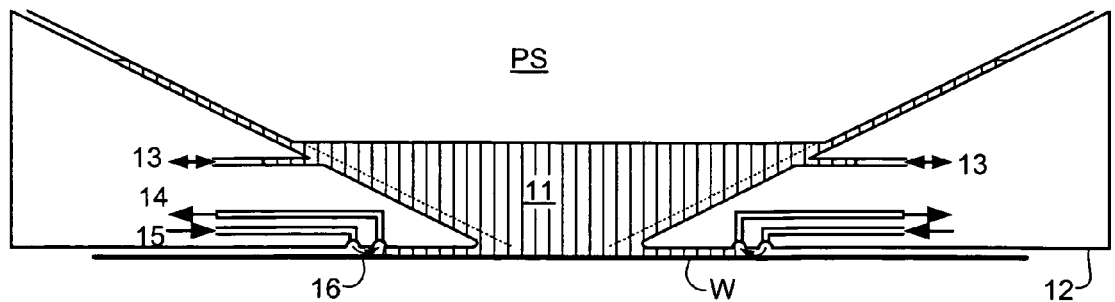
FIG. 5 depicts a further liquid supply system for use in a lithographic projection apparatus.

Another proposed immersion lithography apparatus has a localized liquid supply system having a barrier member (or so-called immersion hood) which extends along at least a part of a boundary of the space between the final element of the projection system and the substrate table. Such an apparatus is illustrated in FIG. 5. The barrier member is substantially stationary relative to the projection system in the XY plane. However, there may be some relative movement in the Z direction (in the direction of the optical axis). A seal is formed between the barrier member and the surface of the substrate.

Referring to FIG. 5, a seal member 16 forms a contactless seal to the substrate around the image field of the projection system so that liquid is confined to fill a reservoir or an immersion space 11 between the substrate surface and the final element of the projection system. The reservoir 11 is formed by a barrier member 12 positioned below and surrounding the final element of the projection system PL. Liquid is brought into the space below the projection system and within the barrier member 12. For example, the liquid may be provided and/or removed through port 13. The barrier member 12 extends a little above the final element of the projection system. The liquid rises above the final element so that a buffer of liquid is provided. The barrier member 12 has an inner periphery that at the upper end, in one arrangement, closely conforms to the shape of the projection system or the final element thereof and may, e.g., be round. At the bottom, the inner periphery closely conforms to the shape of the image field, e.g., rectangular though this need not be the case.

The liquid is confined in the reservoir by a gas seal 16 between the bottom of the barrier member 12 and the surface of the substrate W. The gas seal is formed by gas, e.g. air or synthetic air. In one example, $N_2$ or another inert gas, is provided under pressure via inlet 15 to the gap between barrier member 12 and substrate W. The gas is extracted via first outlet 14. The overpressure on the gas inlet 15, vacuum level on the first outlet 14 and geometry of the gap are arranged so that there is a high-velocity gas flow radially inwards that confines the liquid. Such a system is disclosed in United States patent application publication no. US 2004-0207824.

Figure 6:
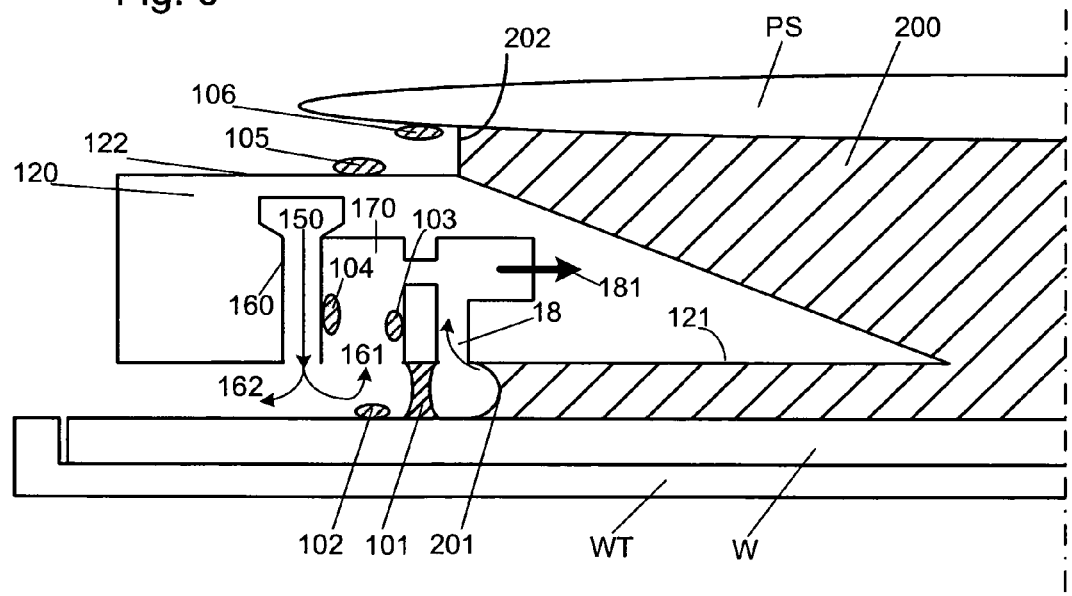
FIG. 6 depicts a close-up cross sectional view of an example barrier member and surrounding area showing typical areas where unwanted droplets may form.

A further example of an immersion lithography apparatus is shown in FIG. 6. The apparatus of FIG. 6 has a liquid handling system for, for example, supplying, containing, and removing immersion liquid. The liquid handling system may comprise a barrier member 120. The liquid handling system can have one or more of: a liquid supply system (not shown in FIG. 6, but analogous to inlet 13 in FIG. 5); a liquid removal system 18, 181; and/or a seal member 160 to hinder movement of immersion liquid past it. The seal member 160 may serve to confine the immersion liquid to a volume. A typical localized area immersion lithographic apparatus, such as that shown in FIG. 6, may serve to contain a main body 200 of the immersion liquid.

One or more unwanted droplets of immersion liquid can be left or formed on any surface of an immersion lithography apparatus, such as its immersion system. FIG. 6 shows a close up view of a cross section through an immersion system and surrounding features of an immersion lithographic apparatus. FIG. 6 shows the position of various unwanted liquid droplets that may form on or be left on one or more surfaces of the illustrated portion of an immersion lithographic apparatus. For simplicity, only half of the cross section through the immersion system and surrounding features is shown. The location of the unwanted droplet(s) shown in FIG. 6 is typical of those that would be found in a conventional immersion lithographic apparatus, as described below. However, it will be understood that one or more unwanted immersion liquid droplets could be formed on any other surface of an immersion lithography apparatus, especially its immersion system.

The shaded areas indicate where the immersion liquid is situated. The only part of the apparatus shown in FIG. 6 where the presence of the immersion liquid is desirable is region 200. The region 200 is bounded by the final element of the projection system PS, the substrate W (or substrate table WT), and a surface of the barrier member 120. A primary meniscus 201 extends between a bottom surface 121 of the barrier member 120 and the substrate W. A liquid edge 202 extends between the barrier member 120 and the final element of the projection system PS. The liquid edge 202 may be formed by, for example, surface tension.

A typical area on which unwanted immersion liquid droplets may be formed is a surface 121 of the barrier member 120 facing the substrate W. As shown in FIG. 6, the barrier member 120 is provided with an immersion liquid extraction duct 18 formed in the surface 121 of the barrier member 120 facing the substrate W. The extraction duct 18 is part of the liquid handling system that controls the flow of immersion liquid through the immersion lithographic apparatus. The duct 18 is one of several needle-type extraction ducts located at different peripheral positions, which may be circumferential positions. The ducts 18 are positioned to surround the area 200. The ducts are arranged to remove the immersion liquid, ultimately through outlet 181 which is open to an underpressure. This system is effective in ensuring that most of the immersion liquid does not pass radially beyond the inlet of extraction duct 18. However some of the immersion liquid may not be extracted through extraction duct 18, and this liquid may then form unwanted droplets outside of the area 200 where the immersion liquid is desired. Such droplets on the barrier member 120 may subsequently fall onto the substrate resulting in defects on the substrate W. Such defects may be shown as arcs and lines in a pattern defect test.

Typically, an unwanted secondary body of immersion liquid 101 can form just beyond the entrance to the extraction duct 18. This secondary body of immersion liquid 101 forms between the surface 121 of the barrier member 120 facing the substrate W and/or the substrate table WT, and the substrate W and/or substrate table WT. When reference is made herein to the substrate W, or to the substrate table WT, this can mean substrate W and substrate table WT. As the substrate W and substrate table WT move relative to the barrier member 120 and projection system PS, the secondary body of immersion liquid 101 moves relative to the substrate W to form a droplet 102 on the surface of the substrate W and/or substrate table WT. This means that a trail of unwanted immersion liquid droplets 102 may be left on the substrate W and/or the substrate table WT. One or more unwanted droplets may also form on the surface 121 of the barrier member. These droplets 102, resulting from the secondary body of immersion liquid 101, may then cause defects on the substrate W and/or substrate table WT. Such defects may be shown as arcs and lines in a pattern defect test.

Liquid that has not been collected by extraction duct 18 could be transported further away from the main body of immersion liquid 200. In order to prevent or at least reduce this, an immersion lithographic device may have a gas seal 160. In the illustrated embodiment, the gas seal 160 is a gas-knife having an inlet 150 through which gas passes. A gas flow from the gas knife 160 is directed towards the substrate W. The gas knife 160 is arranged so as to hinder any immersion liquid passing beyond it. Ideally the gas knife 160 stops any immersion liquid passing beyond it. Arrows 161 and 162 in FIG. 6 show the direction of gas flow paths. Ultimately, the gas flow that follows path 161 (i.e. in the direction towards the main body of immersion liquid 200) also exits through outlet 181. There is provided a recess 170 in the barrier member 120 radially inward (relative to the optical axis of the projection system) of the gas knife 160. This recess 170 is to provide a suitable gas flow exit path for the gas from the gas knife that flows along a flow path 161 radially inward from the gas knife 160.

Unwanted droplets of immersion liquid may form on either side of the gas knife 160. For example, they could be formed on a surface radially inward (relative to the optical axis of the projection system). They could be formed radially outward of the gas knife 160. Unwanted droplets of immersion liquid may form on a surface radially outward of the gas knife 160 because of, for example, gas from the gas knife causing droplets on the substrate or substrate edge to splash upwards onto a surface of the immersion system, such as the lower surface 121 of barrier member 120 that faces the substrate W. In the example shown in FIG. 6, no unwanted immersion liquid droplets are shown on a surface radially outward of the gas knife 160.

In the illustrated example, unwanted immersion liquid droplets have been formed on a surface radially inward of the gas knife 160 (i.e. in the direction towards the main body of immersion liquid 200). Two droplets are shown in the example of FIG. 6. One droplet 103 is on a radially inward surface of the recess 170 forming gas outlet path 161. One droplet 104 is on a radially outward surface of the recess 170 forming gas outlet path 161. Droplets 103 and 104 could be susceptible to falling or draining onto the substrate surface W, for example due to the force resulting from gravity, potentially causing a problem such as discussed above. Any surfaces which experience recirculating gas flow from the operation of the gas knife 160 will be particularly susceptible to having immersion liquid droplets formed thereon.

In addition to those droplets 102, 103 shown in FIG. 6 as having been formed on the surface of the barrier member 120 which faces the substrate W, unwanted immersion liquid droplets may form at any other location. The precise location of the unwanted immersion liquid droplets may depend on, for example, the particular design of the liquid handling system. The precise location of the unwanted immersion liquid droplets may depend on, for example, the particular relative movement of the barrier member 120, projection system PS, substrate W, and substrate table WT.

Unwanted droplets may form on a surface that has a welded joint. It may be particularly difficult to remove all of the immersion liquid from the surface of such a joint.

A further region where unwanted immersion liquid droplets may be formed is on the opposing surfaces of the final element of the projection system PS and the barrier member 120, for example on a surface 122 of the barrier member 120 that faces away from the substrate W. The surface 122 may be located between the substrate W and the final element of the projection system PS, and may be referred to as the upper surface 122 of the barrier member 120. This surface is particularly susceptible to having unwanted immersion liquid droplets formed. The lower surface of the final element of the projection system PS is also particularly susceptible to having unwanted immersion liquid droplets formed thereon.

A reason for this is that, during stepping and/or scanning operations, the substrate table WT and substrate W move relative to the projection system PS, the barrier member 120 and other parts of the liquid handling system. The momentum of the immersion liquid body 200 causes the liquid to move, so that its upper meniscus, i.e. liquid edge 202, moves between the surface of the final element of the projection system and the upper surface of the barrier member 120. The part of the liquid edge at the front of the barrier member in the direction of the scan direction moves towards the optical axis of the projection system; the part of the liquid edge at the rear of the barrier member in the scan direction moves away from the optical axis. When the scan direction reverses in a next scan step, the direction of movement of each portion of the liquid edge changes. So through successive scanning motions, the position of the liquid edge oscillates. As the scan motion is fast, oscillation may be fast and uncontrolled. Thus droplets may be formed by the movement of the liquid edge. This phenomenon is referred to as "sloshing". This relative motion can result in droplets of the immersion liquid being deposited on, for example, the final element of the projection system PS and/or the upper surface 122 of the barrier member 120. The final element of the projection system PS, as referred to herein, could be, for example, a projection lens, such as a so-called WELLE lens. It will be appreciated that in normal use, the level of the immersion liquid between the barrier member 120 and the final element of the projection system PS may vary and that, whenever the immersion liquid recedes from a surface, unwanted droplets may remain.

An immersion system, such as that shown in FIG. 6, may comprise a two-phase extraction system. A function of this two-phase extraction system is to control the position and/or level of the main immersion liquid region 200. For example, the two-phase extraction system may control the level and/or position of the immersion liquid around the final element of the projection system PS. In the embodiment shown in FIG. 6, the two-phase extraction system comprises an extraction duct or outlet 18. An edge 202 of the liquid region 200 that is between an upper surface 122 of barrier member, 120 and a lower surface of the final element of the projection system PS can move inwards (towards the axis of the projection system PS), or outwards (away from the axis of the projection system PS). This can be due to, for example, relative movement of the substrate table WT (and/or substrate W) and the barrier member 120 (and/or the projection system PS) which is too rapid for the two-phase extraction system to compensate for.

The edge 202 of the liquid region 200 could, for example move outward as a result of relative motion of the substrate table WT and the barrier member 120. When the liquid edge 202 subsequently moves inward again, unwanted immersion liquid droplets 105, 106 may be left on the upper surface of the barrier member 120 and/or the lower surface of the final element of the projection system PS.

A further way in which an unwanted droplet can form on the surface 122 of the barrier member 120 (that faces away from the substrate W and/or the substrate table WT) and the lower surface of the final element of the projection system PS (that faces the substrate W and/or the substrate table WT) is by the substrate table WT and/or substrate W relatively moving towards the barrier member 120. This could happen if, for example, an error in control of the substrate W or substrate table WT were to occur. If this happened, the main body of immersion liquid 200 could overflow into the region between the surface 122 of the barrier member 120 facing away from the substrate W, and the lower surface of the final element of the projection system PS. When this overflow of immersion liquid retreats (i.e. when the substrate W and substrate table WT move back away from the barrier member 120), unwanted droplets of immersion liquid could be left on the surface 122 of the barrier member 120 and the lower surface of the final element of projection system PS.

In the example shown in FIG. 6, one unwanted droplet 105 is shown on the upper surface 122 of the barrier member 120. A further unwanted droplet 106 is shown on the lower surface of the projection system PS.

As explained previously, if any unwanted droplet is left on one of the surfaces, then it may evaporate, thereby possibly applying an unwanted heat load to the particular surface. In the case of the droplet 106 on the lower surface of the final element of projection system PS, this could be particularly problematic because an unwanted heat load would be applied to the final element of projection system PS by evaporation of the droplet. This could affect an optical property, and performance, of the projection system PS. This could be particularly problematic if, for example, the final element of the projection system PS were a lens element. During evaporation, the heat load could vary with time leading to an unpredictable variation in an optical property of the projection system PS. Compensating for such an unpredictable variation in optical property may be extremely difficult to achieve.

The droplet 105 on the upper surface 122 of the barrier member 120 may, if left, evaporate causing an unwanted heat load to the barrier member 120. This unwanted heat load may cause deformation of the barrier member 120. This may lead to difficulty in, for example, positioning the barrier member 120. It may lead to an optical property of the main body of immersion liquid 200 being altered.

Further, evaporation of any droplet in the immersion system may cause the various surfaces which bound the main body 200 of immersion liquid to cool down. For example, the lower surface of the final element of the projection system PS, a surface of the barrier member 120, and/or the substrate surface itself could cool down. In turn, this may lead the main body of immersion liquid 200 to cool down itself, thereby affecting an optical property of the main body 200 of immersion liquid such as altering the refractive index of the liquid.

Furthermore, droplet 105 formed on the upper surface 122 of the barrier member 120 and droplet 106 formed on the lower surface of the final element of projection system PS could dynamically interact. For example if they are close enough to each other and/or if they are large enough they could physically join. This could lead to a further heat load related problem. For example it may provide a direct heat conduction path between the final element of projection system PS and the barrier member 120.

Figure 7:
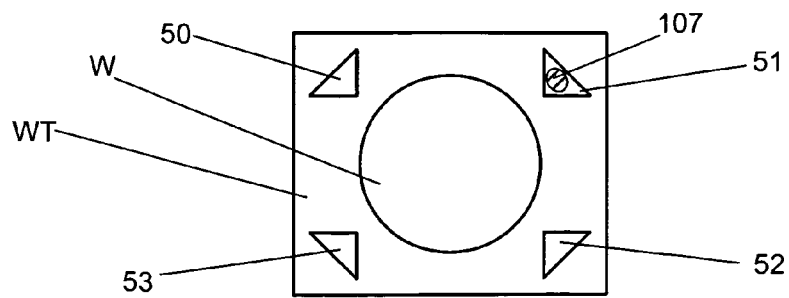
FIG. 7 depicts a plan view of a substrate, substrate table, and sensors.

Another area where unwanted droplets may form is on the surface of a sensor. For example, as shown in FIG. 7, unwanted droplets could form on the surface of one or more sensors on the substrate table WT. In the example of FIG. 7, four sensors 50, 51, 52, 53 are shown. The sensors 50, 51, 52, 53 may be located on and/or formed in the substrate table WT. An unwanted droplet 107 is located on one of the sensors 51. Unwanted droplets could additionally or alternatively be found on any of the other sensors 50, 52, 53, or on a sensor of a different type. Types of sensor on which unwanted droplets could form include: a positioning sensor, a transmission image sensor (TIS), an integrated lens interferometer at scanner (ILIAS) sensor, and/or a spot sensor.

According to an embodiment of the present invention, an active droplet removal system may be used to move any unwanted immersion liquid droplet formed on any surface of the immersion lithographic apparatus. Desirably, the active droplet removal system moves the droplet immediately after it forms. If this is not possible, the active droplet removal system is arranged to move the droplet as quickly as possible. The active droplet removal system may also be arranged to move the droplet before any evaporation of the droplet occurs. If this is not possible, the active droplet removal system may be arranged to move the droplet before significant evaporation of the droplets occur. According to the embodiment shown in FIG. 8, the active droplet removal system comprises a plurality of electrodes.

According to an embodiment of the present invention, the surface or surfaces from which the unwanted droplets can be removed can be open surfaces. For example, the surfaces do not have to be one of a plurality of surfaces that define a volume within which immersion liquid or immersion liquid droplets are enclosed or partially enclosed. The unwanted droplets may be manipulated over a surface using the active droplet removal system of an embodiment of the present invention even if they are not part of a surface that is one of a plurality of surfaces that define a channel, a flow passage, or a conduit. In other words, the only surface which the unwanted droplets are in contact with can be the surface from which they are to be removed or manipulated about. As such, an active droplet removal system according to an embodiment of the present invention is able to move an unwanted immersion liquid droplet even if any capillary force, or net capillary force, acting on the droplet is not large enough to cause capillary action. Thus, even though a capillary force may (or may not) act on the droplet to be moved, it is not required for the droplet to be moved. Thus, the movement of the immersion liquid droplet according to an embodiment of the present invention can be caused by the force provided by the active droplet removal system alone. For example, this could be an electrostatic force provided by, for example, electrodes.

The surface or surfaces from which the unwanted droplets can be removed or manipulated about can be far removed from an adjacent surface. This means that there can be little or no capillarity, i.e. little or no net capillary force due to capillary pressure acting on the unwanted droplets.

The active droplet removal system of an embodiment of the present invention can be applied to any surface of the immersion system as required. This is regardless of the geometrical properties of the surface or surfaces to which it is applied. For example, the surface to which the active droplet removal system may be applied could be flat, or locally flat. Alternatively, the surface to which the active droplet removal system may be applied could be such that the center of curvature and/or the local center of curvature is on the same side of the surface as the side on which the droplet is located. Alternatively, the surface to which the active droplet removal system is applied could be such that the center of curvature and/or the local center of curvature is on the opposite side of the surface to the side on which the droplet is located.

Additionally or alternatively, the shortest distance between the center of curvature of the surface or the local center of curvature of the surface and the surface itself can be greater than the shortest distance between the geometric center of the droplet and the surface.

An embodiment of the present invention can remove unwanted immersion liquid droplets from a portion of a surface without relying on capillary action.

United States patent application publication no. US 2004-0160582 discloses using a combination of capillary action and electrostatic force to urge immersion liquid to flow in a given direction. However, that arrangement relies on capillary action and so would not be suitable to remove liquid droplets from a so called "open surface".

According to an embodiment of the present invention, a plurality of electrodes is formed on any surface from which it is desired, or may be desired, to remove unwanted immersion liquid droplets. This may be a surface on which droplets are likely to form, such as those described above. The electrodes are arranged to manipulate and/or remove unwanted immersion liquid droplets across or from a surface. The electrodes could be provided at any or all of the location or locations where unwanted immersion liquid droplets may be formed.

A voltage can be applied to the electrodes so as to electrostatically manipulate the unwanted immersion liquid droplets on the surface. As such, the electrodes can form an electrostatic pump system to transport unwanted immersion liquid droplets back into the liquid handling system. For example, the immersion liquid droplets may be transferred into the main body of immersion liquid 200 or into the immersion liquid supply system or extraction system.

Figure 9:
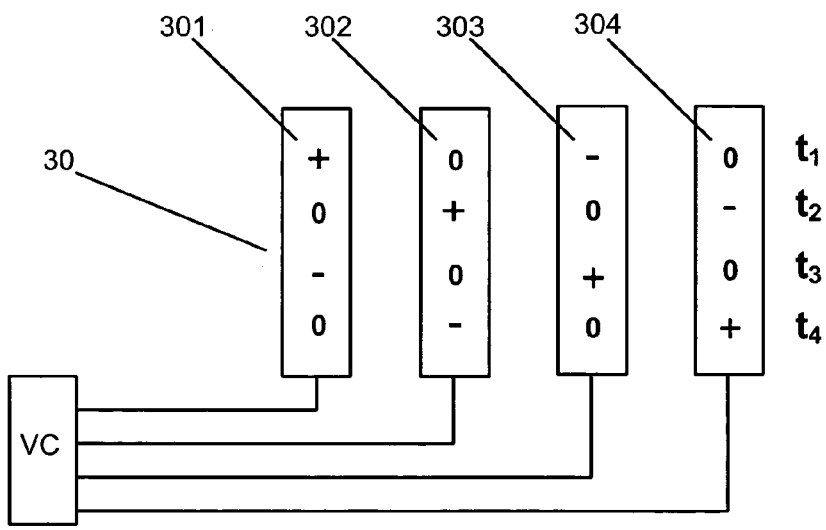
FIG. 9 depicts a plan view an arrangement of electrodes for use in an embodiment of the present invention.

In order to manipulate an unwanted immersion liquid droplet, a plurality of electrodes is used in each area where a droplet is to be manipulated. The plurality of electrodes form an electrode set. An example of such an electrode set is shown in FIG. 9. A controller, such as a voltage controller VC, is used to control the voltages applied to each of the electrodes 301, 302, 303, and 304 in the electrode set 30. The controller can be arranged so as to control the voltage applied to the electrodes so that no voltage is applied at a time when application of a voltage could result in operation of one or more of the elements of the lithographic apparatus being adversely affected. Typically, the distance between the center of each electrode and the centers of adjacent electrodes is in the range 0.1 mm to 1 mm. Desirably, the distance between the center of each electrode and the centers of adjacent electrodes is in the range of 0.25 mm to 0.75 mm. In an embodiment, the distance between the center of each electrode and the centers of adjacent electrodes is in the range of 0.4 mm to 0.6 mm. In an embodiment, the distance between the center of each electrode and the centers of adjacent electrodes is approximately 0.5 mm. The distance between the center of the electrode and the center of adjacent electrodes could be determined by, for example, the breakdown voltage and the droplet size (or expected droplet size).

Figure 8:
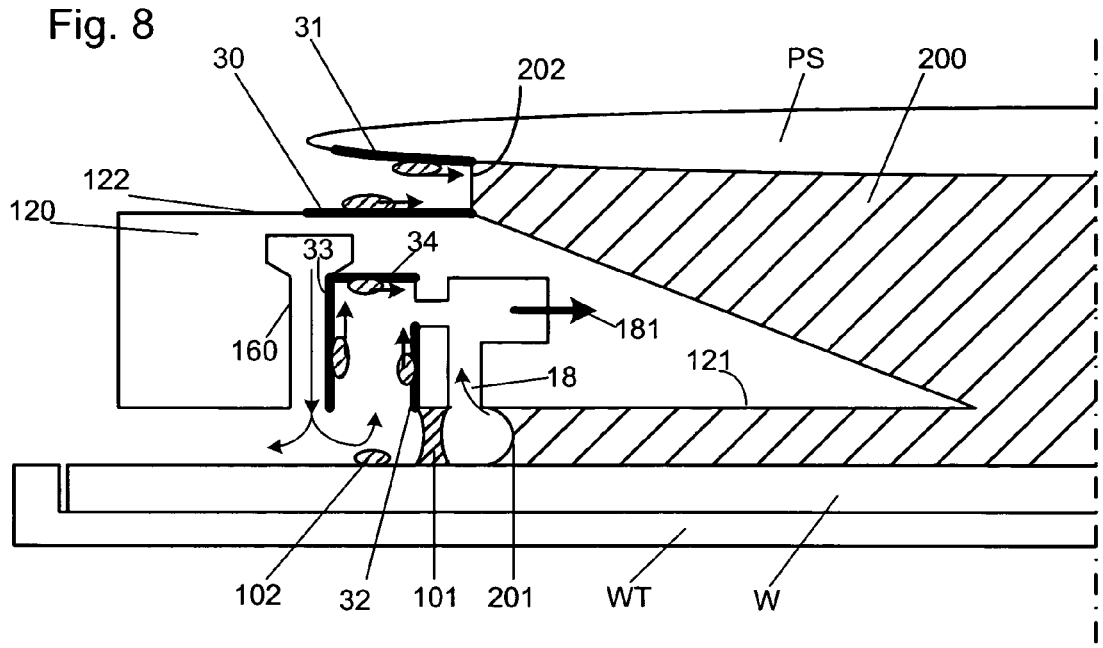
FIG. 8 depicts the close-up view of the example barrier member and surrounding area of FIG. 6, and also shows suitable positions for an electrode according to an embodiment of the present invention.

FIG. 8 shows the location of electrode sets 30, 31, 32, 33, and 34 included in an immersion lithographic apparatus according to an embodiment of the present invention. These electrode sets shown in FIG. 8 are located so as to be able to manipulate the unwanted immersion liquid droplets shown in the example of FIG. 6 and described above. To improve the clarity of FIG. 8, some of the numerals from FIG. 6 have not been included. However, the unwanted droplets shown in FIG. 6 are in the same position in FIG. 8. Thus, electrode set 30 is associated with droplet 105, electrode set 31 is associated with droplet 106, electrode set 32 is associated with droplet 103, and electrode set 33 is associated with droplet 104. As will be appreciated, any combination of the electrode sets could be provided; not all of the electrode sets 30, 31, 32, 33 need be provided.

The arrows on the droplets show the direction in which the electrostatic force provided by the electrode set may act on each droplet. In each case, the electrostatic force may act to guide the unwanted immersion liquid droplets towards the immersion liquid in the liquid handing system e.g. the main body of immersion liquid 200, the immersion liquid supply or the immersion liquid extraction system. In other words, the electrostatic force may act to guide the unwanted immersion liquid droplets towards areas within which the immersion liquid is intended to be contained, and/or from which the immersion liquid may be removed from the immersion system.

An example of an electrode set 30 is shown in detail in FIG. 9. Electrode set 30 comprises a row of separate electrodes 301, 302, 303, 304. The electrodes 301, 302, 303, 304 in electrode set 30 could be serially arranged. Electrode set 30 could be used, for example, as the electrode set to remove unwanted immersion liquid droplet 105 on the upper surface 122 of barrier member 120 shown in FIG. 6. FIG. 9 shows the charge provided to the electrodes from a voltage source at given times. At different times, different voltages may be provided to a given electrode. FIG. 9 shows an example of the voltage (or relative voltage) applied to the four electrodes 301, 302, 303, 304 at four successive times: $t_1$, $t_2$, $t_3$, $t_4$. In the example shown, at time $t_1$, electrode 301 is provided with a positive voltage, electrode 303 is provided with a negative voltage, and electrodes 302 and 304 are provided with no voltage. The voltages (or relative voltages) applied to the electrodes at $t_2$, $t_3$ and $t_4$ can be seen in FIG. 9.

In some embodiments, a repeating pattern of voltages could be applied to each, some, or all of the electrodes 301, 302, 303, 304 over time. Thus, for example, the voltages applied to the electrodes at times $t_1$-$t_4$ shown in FIG. 9 could be cyclic i.e. the pattern could continuously repeat. This continuously repeating cycle of voltages could be configured to result in a continuous movement of one or more of the unwanted droplets. In other words, the voltages applied to the electrodes could be controlled so as to move the droplets with a "pumping action". Different voltage patterns may be used. For example, different voltage patterns may be used at different times and/or different locations.

It is not necessary to have some electrodes provided with a positive voltage, and others with a negative voltage. Instead, different relative voltages may be applied to the electrodes. As such, all of the electrodes 301, 302, 303, 304 could be provided with a positive voltage, but of differing magnitudes. Similarly, all of the electrodes 301, 302, 303, 304 could be provided with a negative voltage, but of differing magnitudes.

In an embodiment, the applied voltage is an alternating current (A.C.). Alternatively, the applied voltage could be a direct current (D.C.).

In the arrangement shown in FIG. 9, the electrodes are shown to be in a parallel row. In the illustrated embodiment, several of these electrode sets 30 are provided peripherally (e.g., circumferentially and/or at the same radial position) around the top surface 122 of the barrier member 120. Thus, the voltage applied to each individual electrode of each electrode set 30 can be controlled individually.

In an embodiment, electrodes 301, 302, 303, 304 within the electrode set 30 could each be provided as one continuous electrode extending around at least part of the upper surface 122 of the barrier member 120. There may be no peripheral (e.g., circumferential) gaps in each of the electrodes 301, 302, 303, 304. Alternatively, there may be one or more peripheral gaps in one, some, or all of the electrodes 301, 302, 303, 304, which may or may not be at the same peripheral position for each electrode 301, 302, 303, 304. Each electrode within the electrode set 30 could be formed at least partly as a band. For example, each electrode within electrode set 30 could be at least partly annular. In this embodiment, just one electrode set 30 could be provided on the top surface 122 of the barrier member 120. In an embodiment, the electrodes 301, 302, 303, 304 may not be parallel to each other.

As explained above, the voltage applied to each of the electrodes within the electrode set 30 can be varied over time. The time variation of the voltage applied to the electrodes can be predetermined. Alternatively, the time variation can be in response to, for example, an unwanted immersion liquid droplet being detected on the upper surface 122 of the barrier member 120 in the region of the electrode set 30.

Applying voltages to electrodes on some surfaces could have an affect on the function, operation and/or intended purpose of the element comprising that surface, or on a neighboring element. For example, a sensor which may be suitable for having an active droplet removal system according to an embodiment of the present invention applied to it may be affected by having voltages applied to electrodes on, in, or near its surface. In order to reduce, or eliminate this issue (should it arise), the time at which the voltages are applied to the electrodes within the electrode set 30 can be carefully controlled. For example, the voltages could be controlled so that no voltage is applied to any electrodes in, on, or near (as appropriate) an element that may be affected by an applied voltage during periods when those elements are active. For example, a voltage could only be applied to an electrode in, near, or on the surface of a sensor when that sensor is not active.

Figure 10:
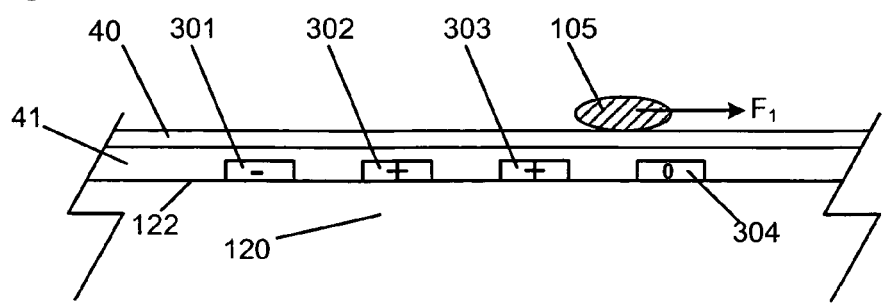
FIG. 10 depicts a cross sectional view of part of a barrier member with electrodes thereon for use in an embodiment of the present invention.

FIG. 10 shows a partial cross section through electrode set 30 and barrier member 120. Unwanted immersion liquid droplet 105 is also shown in FIG. 10. The direction of arrow $F_1$ shows the electrostatic force acting on unwanted immersion liquid droplet 105 due to the voltage applied to electrodes 301, 302, 303 and 304. It is this electrostatic force that urges the unwanted immersion liquid droplet 105 towards the main body of immersion liquid 200, according to the illustrated embodiment.

FIG. 10 shows the upper surface 122 of the barrier member 120 and the electrodes 301, 302, 303 and 304 as being covered by an optional insulating layer 41. This insulating layer may cover each of the electrodes (for example, to create a flat surface), while ensuring each electrode is electrically isolated from the other electrodes.

FIG. 10 also shows a coating 40 covering the insulating layer 41. In an embodiment, the coating 40 could cover the upper surface 122 of barrier member 120 and the electrode set 30 directly. This coating 40 is desirably a liquid-phobic coating. The liquid-phobic coating may comprise a polytetraflouroethylene type material. As such, the coating 40 may be such that the contact angle between the immersion liquid and the surface is greater than 90 degrees, or greater than 120 degrees. The coating 40 may be hydrophobic. The coating 40 further encourages the unwanted immersion liquid droplet 105 away from the upper surface 122 of the barrier member 120. A single coating may be provided on the upper surface 122 of the barrier member 120 and the electrode set 30 that is both electrically insulating and liquid-phobic.

In an embodiment, the liquid-phobic coating 40 may not be present, but the unwanted immersion liquid droplet 105 could still be urged towards the main body of immersion liquid 200. This is due to the electrostatic force $F_1$ provided by the electrode set 30. Thus, the liquid-phobic coating 40 is optional.

In an embodiment, a combination of liquid-phobic and liquid-philic surfaces (liquid-philic surfaces being those which have a contact angle to an immersion liquid droplet of less than 90 degrees) could be used to cover the upper surface 122 of barrier member 120 and/or the electrode set 30. This combination of liquid-phobic and liquid-philic surfaces could be arranged to further encourage removal of unwanted immersion liquid droplets from certain areas.

The use of a coating or surface with a specific contact angle relationship with the immersion liquid, for example a hydrophobic surface, may be undesirable when the coating or surface is exposed to UV radiation for example in combination with immersion liquid. The contact angle relationship may change. Therefore for such a coating or surface which is exposed to immersion liquid and UV radiation, for which stable contact angle behavior with the immersion liquid is desirable, it may be desirable to use an active droplet removal device in combination with a coating, if not alone.

The surface or coating may undergo accelerated aging under the influence of UV radiation and immersion liquid. The aging may affect the optical properties of the surface or coating. So, for example, having a coating over a critical feature in an immersion system, for example a sensor or a specific feature of a sensor such as the marks of a TIS, may be undesirable. The deterioration of the coating or surface can affect overlay and focusing performance. So using a coating on some features of an immersion system may be undesirable. Application of an active droplet removal device in combination with a coating (for example on an adjacent non-critical feature), if not alone may be desirable.

Figure 11:
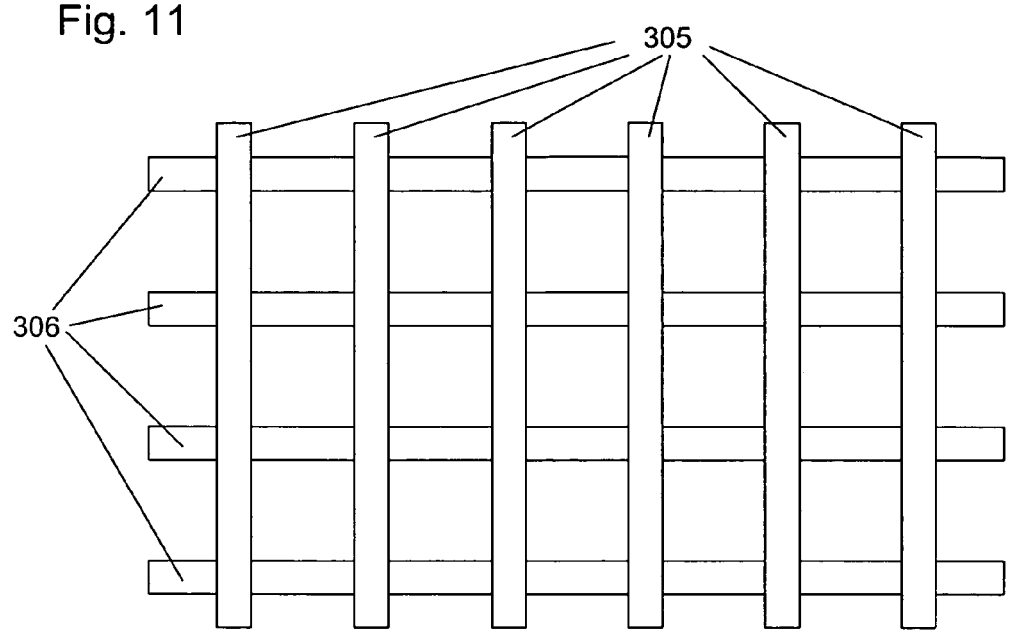
FIG. 11 depicts a plan view of a grid-pattern arrangement of electrodes for use in an embodiment of the present invention.

According to the electrode set 30 shown in FIGS. 9 and 10 of the embodiment shown in FIG. 8, the electrodes of an embodiment of the present invention are arranged in a row. However, in an embodiment, a grid pattern of electrodes could be used. Such a grid pattern is shown in FIG. 11. Thus, there may be two substantially perpendicular rows of electrodes intersecting each other. FIG. 11 shows a vertical set of electrodes 305 (as drawn), and a horizontal set of electrodes 306 (as drawn). In this arrangement, the perpendicular electrodes are desirably electrically isolated from each other. Thus, while they form a grid pattern, they are desirably not electrically interconnected. This embodiment facilitates manipulation of the unwanted immersion liquid droplets in two dimensions across the surface on which they are located. This is because an electrostatic force could be provided in one direction by one of the rows of electrodes in the grid pattern, and in another direction by the perpendicular row of electrodes in the grid pattern of the electrode set.

The choice of liquid used in the immersion lithographic apparatus could have an affect on the magnitude of the force provided to the unwanted immersion liquid droplets. For example, droplets from an ionic solution would be more easily polarized, and thus would experience a greater electrostatic force. The greater the electrostatic force, the greater the magnitude of acceleration of the unwanted immersion liquid droplet, and thus the quicker it is removed from the surface on which it is located. Thus, in an embodiment, an ionic solution would be used for the immersion liquid. For example, a dilute ionic solution formed by dissolving carbon dioxide in water may be used. It is not essential for an ionic solution to be used with the apparatus of an embodiment of the present invention, but use of such a solution would aid manipulation of the unwanted immersion liquid droplets.

It will also be understood that, if an ionic solution is used, then if it is not removed for some period of time such that some unwanted evaporation does occur, then the concentration of the solutes in the droplets would increase. As it does so, the force to mass ratio acting on the droplet would increase. Therefore, the acceleration of the droplets away from the surface on which they are located, and on which they need to be removed, would be increased. Thus, even if some evaporation of the unwanted immersion liquid droplets occurs, the possibility of significant evaporation occurring is reduced further.

An embodiment of the invention has been described in relation to unwanted immersion liquid droplets at specified locations. However, it will be understood that an electrode set 30 according to an embodiment of the present invention may be provided at any location where unwanted immersion liquid droplets may be formed, located, or left. For example, an electrode set may be located on the top surface of the substrate table WT. This may be desirable because, for example, immersion liquid droplets may be left on the top surface of the substrate table from when it is immersed in immersion liquid during exposure of dies located towards the edge of the substrate W.

An embodiment of the invention has been thus far described in relation to an embodiment for use with an immersion lithographic apparatus having a needle-type extraction duct or outlet 18. However an embodiment of the invention could be used with any type of immersion lithographic apparatus. According to an embodiment of the invention, the active droplet removal system comprising electrodes may be provided for an immersion lithographic apparatus having a single-phase extraction system. This could be, for example, a porous member immersion liquid extraction system as shown in FIG. 12.

In this embodiment, the liquid extraction system comprises a chamber 171 which is maintained at a slight underpressure and is filled with the immersion liquid. The lower surface of the chamber is formed of a porous member 17 (also known as a micro-sieve) having a plurality of small holes, e.g. of diameter in the range of 5 to 50 µm. The lower surface of the chamber is maintained at a height in the range of 50 µm to 1 mm, or in the range of 50 µm to 300 µm, above a surface from which liquid is to be removed, e.g. the surface of a substrate W. The porous member 17 may be a perforated plate or any other suitable structure that is configured to allow the liquid to pass therethrough. In an embodiment, porous member 17 is at least slightly liquidphilic, i.e. having a contact angle of less than 90° to the immersion liquid.

The underpressure is such that menisci formed in the holes in the porous member 17 prevent gas being drawn into the chamber 171 of the immersion liquid extraction system. However, when the porous member 17 comes into contact with liquid on the surface W there is no meniscus to restrict flow. Thus, the liquid can flow freely into the chamber 171 of the immersion liquid extraction system. Such a device can remove most of the liquid from the surface of a substrate W, and so contain the liquid in the main liquid body 200.

Figure 12:
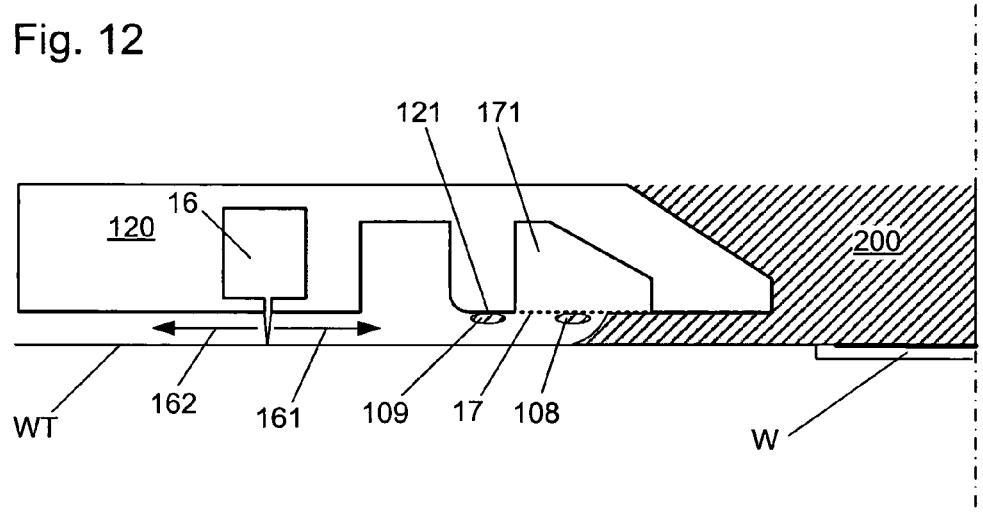
FIG. 12 depicts a cross sectional view of a different type of barrier member and surrounding area showing where droplets might form in an immersion lithography apparatus.

In the example of FIG. 12, the immersion fluid extraction system is formed by a ring-shaped chamber 171 near the innermost edge of the underside of the barrier member 120. The lower surface of the chamber 171 is formed by a porous member 17 (for example, a perforated plate) as described above. Ring-shaped chamber 171 is connected to a suitable pump or pumps to remove liquid from the chamber and maintain the desired underpressure. In use, the chamber 171 is full of liquid but is shown empty in FIG. 12 for clarity.

As shown in FIG. 12, unwanted droplets 108 may form on the surface of the porous member 17. According to an embodiment of the invention, an active immersion liquid removal system is provided to remove these unwanted droplets 108 from the porous member 17. This can assist in keeping the porous member 17 functioning properly. This can be achieved by providing a set of electrodes to electrostatically move the unwanted droplets, as explained above. For example, these electrodes may be provided on the porous member 17 itself, or on a nearby surface.

For example, electrodes could be provided on a surface 121 of the barrier member 120 that faces the substrate W in order to urge an unwanted droplet 109 towards the porous member 17, as shown in FIG. 12.

According to an embodiment of the invention, one or more electrode sets may be provided to remove unwanted immersion liquid droplets formed on surfaces of an "all-wet" immersion lithographic apparatus. In particular, one or more electrode sets may be provided to remove unwanted immersion liquid droplets formed on surfaces of an immersion system of an "all-wet" immersion lithographic apparatus.

An "all-wet" immersion lithographic apparatus comprises an immersion lithography system in which the immersion liquid is unconfined by the liquid supply system of its immersion system. Thus, at least the whole of the major surface of the substrate W undergoing exposure is immersed by liquid during exposure. Thus, even areas of the substrate that are not being exposed at a given time are still covered by immersion liquid. This is in contrast to the embodiments described above in which only an area surrounding the target portion of a substrate W (i.e., that portion of the substrate W currently being exposed) is covered by an immersion liquid during exposure. An example of part of the substrate W, substrate table WT and immersion liquid 300 for an "all-wet" immersion lithographic apparatus is shown in FIG. 13.

The examples of where unwanted immersion liquid droplets may be formed described above in relation to other embodiment are still applicable to an "all-wet" immersion lithographic apparatus. In addition or alternatively, an "all-wet" immersion lithographic apparatus, such as that shown in part in FIG. 13, may use one or more electrode sets to remove unwanted immersion liquid droplets from other areas. For example, unwanted droplets may be removed from the gridplates, skirts and encoder heads (all of which may affect the positioning system), and from the substrate table WT.

Figure 13:
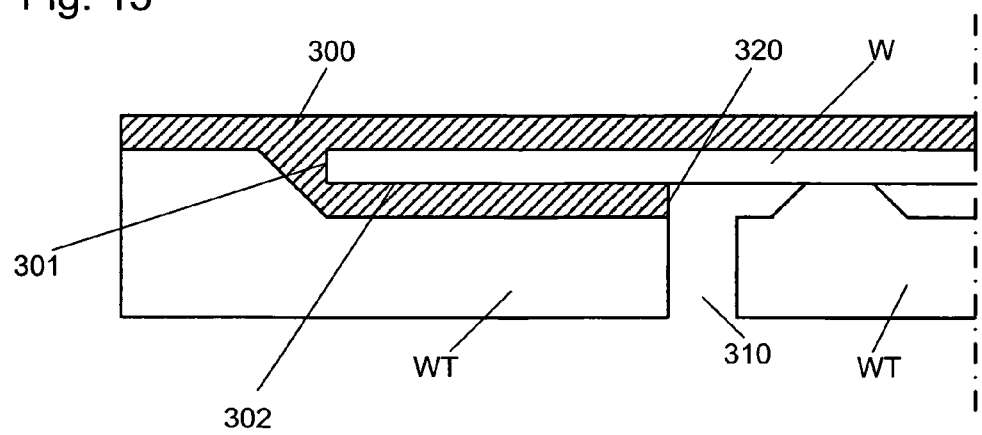
FIG. 13 depicts a cross sectional view of part of a substrate table, substrate and immersion fluid in an immersion lithography apparatus to which an embodiment of the present invention could be applied.

FIG. 13 shows that, in use, in an "all-wet" immersion system, the gap between the substrate edge 301 and the substrate table WT is filled with immersion liquid during operation. Furthermore, the gap between the lower surface 302 of the substrate W (i.e. the surface that faces the substrate table WT in operation), and the substrate table WT may also be filled with immersion liquid during operation. In FIG. 13, the boundary 320 of the liquid body 300 that is between the surface of the substrate W facing the substrate table WT and the substrate table WT itself could be a physical boundary present during operation. Alternatively, the liquid boundary 320 could be formed by surface tension.

It is undesirable for droplets of immersion liquid to remain in these gaps, and/or on the substrate surfaces, even after drying. Any droplets remaining on the substrate table WT may prevent a subsequent substrate W being located properly on the substrate table WT. This increases the chance of incorrect positioning of the substrate W. Further, when the subsequent substrate W is located on the substrate table WT, any unwanted immersion liquid droplets remaining on the substrate table WT could splash onto other areas, including onto the substrate W itself. As these unwanted immersion liquid droplets may evaporate, they could lead to one or more problems outlined above. These problems include leaving drying stains and/or contaminating particles on, and/or causing unwanted heat load in, the elements comprising the surface on which they are located.

Figure 14:
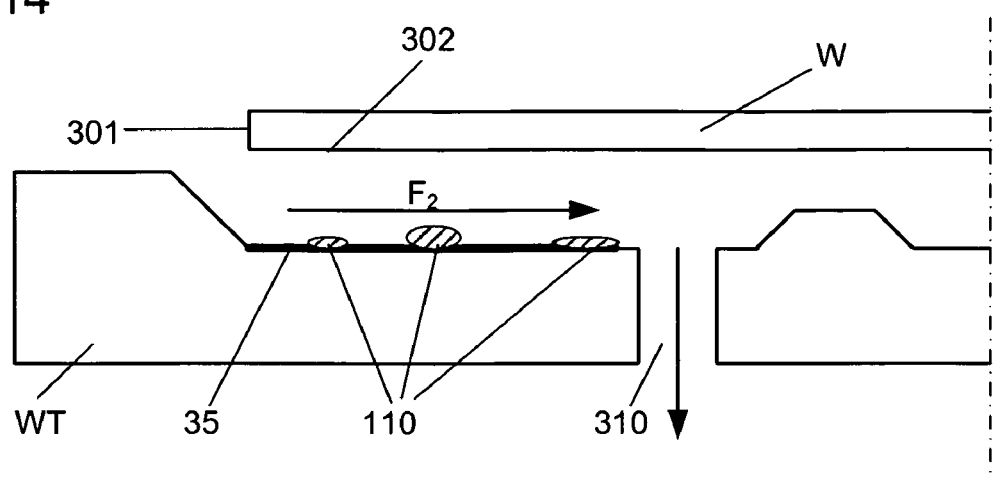
FIG. 14 depicts a cross sectional view of the FIG. 13 apparatus showing possible locations of unwanted droplets and suitable positions for electrodes according to an embodiment of the invention.

FIG. 14 shows examples of where unwanted immersion liquid droplets 110 may be located after removal of the substrate W from the substrate table WT in an "all-wet" immersion system and subsequent drying. In the example shown in FIG. 14, all of the droplets 110 are shown to be on the surface of the substrate table WT that faces the lower surface 302 of the substrate W during operation. However, droplets may be formed on any other surface of the substrate table WT or of the substrate W. For example, droplets could be left on the surface of the substrate table WT located next to the peripheral edge surface 301 of the substrate W during operation.

Additional or alternative electrode sets can be provided in appropriate areas of the "all-wet" immersion system in order to remove such unwanted immersion liquid droplets. For example, electrode sets may be provided on the base of the substrate table WT, i.e. on the surface of the substrate table WT that faces the substrate W.

In the example shown in FIG. 14, an electrode set 35 is provided. Electrode set 35 can urge the unwanted droplets 110 towards the liquid outlet 310. As such, the force provided to the droplets 110 could be in the direction of arrow $F_2$ in FIG. 14.

Electrode sets may be provided in a gap between the substrate table WT and the peripheral edge surface of substrate W itself. Indeed, electrode sets could be provided anywhere where removal or manipulation of unwanted droplets is desirable.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention may be practiced otherwise than as described. For example, the invention may take the form of one or more computer programs containing one or more sequences of machine-readable instructions describing a method as disclosed above, or one or more data storage medium (e.g. semiconductor memory, magnetic or optical disk) having such one or more computer program stored therein. The one or more different controllers referred to herein may be operable when the one or more computer programs are read by one or more computer processors located within at least one component of the lithographic apparatus. One or more processors are configured to communicate with the at least one of the controllers; thereby the controller(s) operate according the machine readable instructions of one or more computer programs.

One or more embodiments of the invention may be applied to any immersion lithography apparatus, in particular, but not exclusively, those types mentioned above and whether the immersion liquid is provided in the form of a bath, only on a localized surface area of the substrate, or is unconfined. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion liquid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

In an embodiment, there is provided an immersion lithographic apparatus comprising: a surface from at least a portion of which a fluid droplet is to be removed; and an active droplet removal system formed on or in the surface, wherein the portion of the surface is sufficiently removed from adjacent portions of the apparatus for there to be insufficient net capillary force acting on a fluid droplet on the portion of the surface to cause the fluid droplet to move by capillary action, and the active droplet removal system is arranged to manipulate the fluid droplet on the portion of the surface without the assistance of capillary action.

The active droplet removal system may comprise an electrode set formed on or in the surface, the electrode set comprising a plurality of electrodes. In an embodiment, the electrodes are arranged within the electrode set such that a voltage can be applied to them so as to electrostatically manipulate fluid on the surface. In an embodiment, the electrodes are arranged so as to remove fluid from the surface or from a part of the surface. In an embodiment, the electrodes are arranged in the electrode set in rows. In an embodiment, the electrodes are arranged along a direction in which fluid on the surface can be manipulated. In an embodiment, a distance between the center of each electrode is selected from the range of 0.1 mm to 1 mm. In an embodiment, the electrodes are arranged in the electrode set in a grid pattern comprising two substantially perpendicular rows of electrodes.

The apparatus may comprise a controller arranged to control the voltage applied to the electrodes. In an embodiment, the controller is arranged to apply a continuously repeating cycle of different voltages to one or more of the electrodes. In an embodiment, the controller is arranged to control the voltage applied to the electrodes so that no voltage is applied at a time when application of a voltage could result in operation of one or more of the elements of the lithographic apparatus being adversely affected.

The portion of the surface may be an open surface. In an embodiment, the open surface is an unenclosed surface. In an embodiment, the open surface is a surface whose center of curvature is on the opposite side of the surface to the side on which the droplet is situated. In an embodiment, the surface is not one of a plurality of surfaces that surround a space. In an embodiment, the surface is not a surface that forms part of a channel. In an embodiment, the portion of the surface is sufficiently removed from other surfaces for it not to be possible for a fluid used as an immersion fluid in the immersion lithography apparatus to form a meniscus between the portion of the surface and another surface. The surface can be any surface of the immersion lithography apparatus other than a surface through which a projection beam is transmitted.

In an embodiment, the lithographic apparatus comprises: a substrate table configured to hold a substrate, the surface being part of the substrate table; and/or a projection system configured to project a patterned radiation beam onto a target portion of the substrate, the projection system comprising a final element, the surface being part of the projection system; and/or a fluid handling system comprising a barrier member and configured to supply, contain, and/or remove fluid to a space between the final element and the substrate, the surface being part of the barrier member; and/or a sensor, the surface being part of a sensor.

In an embodiment, the electrodes are arranged such that fluid can be manipulated on the surface using only electrostatic forces generated by the electrodes. In an embodiment, the electrodes are arranged to electrostatically manipulate immersion fluid. In an embodiment, the electrodes are arranged to electrostatically manipulate a dilute ionic solution. In an embodiment, the dilute ionic solution is acidic. In an embodiment, the dilute ionic solution comprises water with dissolved carbon dioxide.

In an embodiment, the surface and/or the electrodes are at least partially covered in a liquid-phobic material. In an embodiment, the liquid-phobic material comprises a polytetrafluoroethylene type material.

In an embodiment, there is provided an immersion lithographic apparatus comprising: a surface from at least a portion of which a fluid droplet is to be removed; and an active droplet removal system formed on or in the surface and configured to manipulate a fluid droplet around the surface, wherein the active droplet removal system is arranged to manipulate a fluid droplet that is in contact with no surfaces other than the surface comprising the portion from which it is to be removed.

In an embodiment, there is provided an immersion lithographic apparatus comprising: a surface from at least a portion of which a fluid droplet is to be removed; and an active droplet removal system formed on or in the surface and configured to manipulate a fluid droplet around the surface, wherein the portion of the surface is sufficiently removed from all other surfaces that surface tension of the fluid is not sufficient for fluid to bridge a gap between the portion of the surface and any other surface, and the active droplet removal system is arranged to manipulate a fluid droplet on the portion of the surface.

In an embodiment, there is provided an immersion lithographic apparatus comprising: a surface from at least a portion of which a fluid droplet is to be removed; and an active droplet removal system formed on or in the surface and configured to manipulate a fluid droplet around the surface, wherein the active droplet removal system is arranged to manipulate a fluid droplet on the portion of the surface, and a center of curvature of the portion of the surface is on the opposite side of the surface to the side on which the fluid droplet is to be manipulated.

In an embodiment, there is provided a device manufacturing method comprising: projecting a patterned beam of radiation onto a substrate using a projection system; supplying immersion fluid, using an immersion system, to a space between the projection system and the substrate; and removing, without the assistance of capillary action, an unwanted droplet of the immersion fluid on which insufficient net capillary force to cause the droplet to move by capillary action is acting from a portion of a surface of the projection system or the immersion system by applying a controlled voltage to electrodes provided in or on the surface.

In an embodiment, the droplet is removed from an open surface. In an embodiment, the droplet is removed from a portion of a surface that does not form part of a channel. In an embodiment, the droplet is removed from a portion of a surface that does not form part of a duct. In an embodiment, the droplet is removed from a portion of a surface that is not one of a plurality of surfaces that surround a space. In an embodiment, the droplet is not in contact with any surface other than the surface that comprises the portion from which it is to be removed. In an embodiment, the surface tension of the fluid of the droplet is not sufficient for the fluid to bridge a gap between the portion of the surface and any other surface. In an embodiment, the unwanted droplet is a liquid droplet.

The descriptions above are intended to be illustrative, not limiting. Thus, it will be apparent to one skilled in the art that modifications may be made to the invention as described without departing from the scope of the claims set out below.

The invention claimed is:

1. An immersion lithographic apparatus comprising:
a projection system configured to project a patterned radiation beam onto a target portion of a substrate;
a fluid handling system comprising a barrier member and configured to supply fluid to, contain fluid within, and/or remove fluid from, a space between the projection system and the substrate, a part of the optical axis of the projection system passing through the space toward the substrate;
a surface from at least a portion of which a fluid droplet is to be removed; and
an active droplet removal system formed on or in the surface, wherein
the portion of the surface is removed from adjacent portions of the apparatus such that net capillary force, if any, acting on a fluid droplet on the portion of the surface does not cause the fluid droplet to move by capillary action, and
the active droplet removal system is arranged to manipulate the fluid droplet on the portion of the surface without the assistance of capillary action and to move the fluid droplet toward the part of the optical axis passing through the space.

2. The apparatus of claim 1, wherein the active droplet removal system comprises an electrode set formed on or in the surface, the electrode set comprising a plurality of electrodes.

3. The apparatus of claim 2, wherein the electrodes are arranged within the electrode set such that a voltage can be applied to them so as to electrostatically manipulate fluid on the surface.

4. The apparatus of claim 3, wherein the electrodes are arranged so as to remove fluid from the surface or from a part of the surface.

5. The apparatus of claim 3, wherein the electrodes are arranged in the electrode set in rows.

6. The apparatus of claim 3, wherein the electrodes are arranged along a direction in which fluid on the surface can be manipulated.

7. The apparatus of claim 3, wherein a distance between the center of each electrode is selected from the range of 0.1 mm to 1 mm.

8. The apparatus of claim 3, wherein the electrodes are arranged in the electrode set in a grid pattern comprising two substantially perpendicular rows of electrodes.

9. The apparatus of claim 3, comprising a controller arranged to control the voltage applied to the electrodes.

10. The apparatus of claim 9, wherein the controller is arranged to apply a continuously repeating cycle of different voltages to one or more of the electrodes.

11. The apparatus of claim 9, wherein the controller is arranged to control the voltage applied to the electrodes so that no voltage is applied at a time when application of a voltage could result in operation of one or more of the elements of the lithographic apparatus being adversely affected.

12. The apparatus of claim 1, wherein the portion of the surface is an open surface.

13. The apparatus of claim 12, wherein the open surface is a surface whose center of curvature is on the opposite side of the surface to the side on which the droplet is situated.

14. The apparatus of claim 3, wherein the electrodes are arranged such that fluid can be manipulated on the surface using only electrostatic forces generated by the electrodes.

15. The apparatus of claim 3, wherein the electrodes are arranged to electrostatically manipulate immersion fluid.

16. The apparatus of claim 3, wherein the electrodes are arranged to electrostatically manipulate an ionic solution.

17. The apparatus of claim 16, wherein the dilute ionic solution is acidic.

18. The apparatus of claim 17, wherein the dilute ionic solution comprises water with dissolved carbon dioxide.

19. The apparatus of claim 3, wherein the surface and/or the electrodes are at least partially covered in a liquid-phobic material.

20. The apparatus of claim 19, wherein the liquid-phobic material comprises a polytetrafluoroethylene material.

21. The apparatus of claim 1, wherein the surface is not one of a plurality of surfaces that surround a space.

22. The apparatus of claim 1, wherein the surface is not a surface that forms part of a channel.

23. The apparatus of claim 1, wherein the portion of the surface is sufficiently removed from other surfaces for it not to be possible for a fluid used as an immersion fluid in the immersion lithography apparatus to form a meniscus between the portion of the surface and another surface.

24. The apparatus of claim 1, wherein the surface can be any surface of the immersion lithography apparatus other than a surface through which a projection beam is transmitted.

25. The apparatus of claim 1, wherein the lithographic apparatus comprises:
a substrate table configured to hold a substrate, the surface being part of the substrate table; and/or
the surface being part of the projection system; and/or
the surface being part of the barrier member; and/or
a sensor, the surface being part of a sensor.

26. An immersion lithographic apparatus comprising:
a projection system configured to project a patterned radiation beam onto a target portion of the substrate;
a fluid handling system comprising a barrier member located, in use, above and separate from the substrate, the barrier member having an outlet to remove fluid from a space between the projection system and the substrate, a part of the optical axis of the projection system passing through the space toward the substrate;
a surface from at least a portion of which a fluid droplet is to be removed; and
an active droplet removal system formed on or in the surface and configured to manipulate a fluid droplet around the surface, wherein
the portion of the surface is removed from all other surfaces such that fluid does not bridge a gap between the portion of the surface and any other surface due to surface tension of the fluid, and
the active droplet removal system is arranged to manipulate a fluid droplet on the portion of the surface and to move the fluid droplet toward the part of the optical axis passing through the space, toward the outlet, or toward both.

27. An immersion lithographic apparatus comprising:
a surface from at least a curved portion of which a fluid droplet is to be removed; and
an active droplet removal system formed on or in the surface and configured to manipulate a fluid droplet around the surface, wherein
the active droplet removal system is arranged to manipulate a fluid droplet on the portion of the surface, and
a center of curvature of the portion of the surface is on the opposite side of the surface to the side on which the fluid droplet is to be manipulated.

28. A device manufacturing method comprising:
projecting a patterned beam of radiation onto a substrate using a projection system;
supplying immersion fluid, using an immersion system, to a space between the projection system and the substrate, a part of the optical axis of the patterned beam passing through the space toward the substrate;
removing immersion fluid using an outlet located above the substrate and with respect to which the substrate moves; and
removing, without the assistance of capillary action, an unwanted droplet of the immersion fluid on which insufficient net capillary force to cause the droplet to move by capillary action is acting from a portion of a surface of the projection system or the immersion system by applying a controlled voltage to electrodes provided in or on the surface to move the fluid droplet toward the part of the optical axis passing through the space, toward the outlet, or toward both.

29. The method of claim 28, wherein the droplet is removed from an open surface.

30. The method of claim 28, wherein the droplet is removed from a portion of a surface that does not form part of a channel.

31. The method of claim 28, wherein the droplet is removed from a portion of a surface that does not form part of a duct.

32. The method of claim 28, wherein the droplet is removed from a portion of a surface that is not one of a plurality of surfaces that surround a space.

33. The method of claim 28, wherein the droplet is not in contact with any surface other than the surface that comprises the portion from which it is to be removed.

34. The method of claim 28, wherein the portion of the surface is removed from all other surfaces such that fluid of the droplet does not bridge a gap between the portion of the surface and any other surface due to surface tension of the fluid.

35. The method of claim 28, wherein the unwanted droplet is a liquid droplet.

* * * * *